US007539914B1

(12) United States Patent
Sundararajan et al.

(10) Patent No.: US 7,539,914 B1
(45) Date of Patent: May 26, 2009

(54) METHOD OF REFRESHING CONFIGURATION DATA IN AN INTEGRATED CIRCUIT

(75) Inventors: Prasanna Sundararajan, San Jose, CA (US); Jorn W. Janneck, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 579 days.

(21) Appl. No.: 11/334,340

(22) Filed: Jan. 17, 2006

(51) Int. Cl.
*G01R 31/28* (2006.01)
(52) U.S. Cl. .................................................. 714/725
(58) Field of Classification Search ................. 714/725
See application file for complete search history.

(56) References Cited

U.S. PATENT DOCUMENTS

| 5,859,544 | A  | * | 1/1999  | Norman ........................ 326/40 |
| 6,237,124 | B1 | * | 5/2001  | Plants ......................... 714/763 |
| 7,036,059 | B1 | * | 4/2006  | Carmichael et al. ......... 714/725 |
| 7,173,448 | B2 | * | 2/2007  | Plants ............................ 326/9 |
| 7,383,479 | B1 | * | 6/2008  | Carmichael et al. ......... 714/725 |
| 2001/0032318 | A1 | * | 10/2001 | Yip et al. .................... 713/190 |
| 2001/0037482 | A1 | * | 11/2001 | Plants ......................... 714/763 |
| 2004/0015758 | A1 | * | 1/2004  | Pathak et al. ................ 714/725 |

OTHER PUBLICATIONS

"Time partitioning framework for fully reconfigurable systems" by Ouni et al. This paper appears in: Microelectronics, 2004. The 16th International Conference on ICM 2004 Proceedings. Publication Date: Dec. 6 -8, 2004 On pp. 742-745 ISBN: 0-7803-8656 INSPEC Accession No. 8382399.*

U.S. Appl. No. 10/917,033, Patterson et al., filed Aug. 12, 2004.

U.S. Appl. No. 10/917,064, Patterson et al., filed Aug. 12, 2004.

Carmichael, Carl et al. ; "Correcting Single-Event Upsets Through Virtex Partial Configuration", Jun. 1, 2000, pp. 1-12, XAPP216, v1.0, available from Xilinx, Inc., 2100 Logic Drive, San Jose, CA 95124.

* cited by examiner

*Primary Examiner*—Cynthia Britt
(74) *Attorney, Agent, or Firm*—LeRoy D. Maunu; Thomas George (57) ABSTRACT

Configuration memory cells in an integrated circuit (IC) may be corrupted by cosmic radiation and other sources, causing improper operation of the IC. Reliability of an IC is improved by refreshing subsets, such as frames, of the configuration data according to a schedule that has one subset being refreshed more frequently than another subset. For each subset of the configuration data, a respective indicator is determined that indicates whether a subset of configuration memory of the IC requires refreshing with the subset of configuration data. The indicator may be a probability that corruption of the subset of configuration memory results in improper operation. A schedule for refreshing the subsets of configuration memory is generated from the indicators. The subsets of configuration memory are refreshed according to the schedule, with one subset being refreshed more frequently than another subset.

18 Claims, 5 Drawing Sheets

METHOD OF REFRESHING CONFIGURATION DATA IN AN INTEGRATED CIRCUIT

FIELD OF THE INVENTION

The present invention generally relates to configuration data and more particularly to refreshing configuration data used to configure an integrated circuit.

BACKGROUND

Integrated circuits (ICs), such as programmable logic devices (PLDs), may be programmed to implement a wide variety of user designs. Configuration data is generated from a specification of a particular user design and the configuration data is loaded into a PLD to program the PLD to implement the particular user design. The configuration data loaded into the PLD may be stored in the PLD in memory, such as SRAM memory. Each bit of the configuration data stored in SRAM memory may control a programmable resource such as a programmable routing resource or a programmable logic resource of the PLD. The PLD is programmed to implement a particular user design by controlling the programmable routing and logic resources with appropriate values for each bit of the configuration data.

The programming of a PLD with configuration data may intentionally overwrite configuration data previously stored in the PLD. The configuration data stored in a PLD may also be susceptible to unintentional alteration. For example, an atomic particle of cosmic radiation from outer space may enter the Earth's atmosphere and collide with an atom above a PLD. This collision and subsequent secondary collisions may release a narrow stream of many atomic particles including electrically charged atomic particles. The narrow stream of atomic particles may impact an SRAM memory cell storing a bit of the configuration data, and deliver enough electric charge to the SRAM memory cell to invert the bit of configuration data stored in the SRAM memory cell. The altered bit of configuration data may modify the function provided by an associated programmable routing or logic resource and may consequently cause improper operation that deviates from the expected behavior for the user design in the PLD.

While such unintentional alteration of configuration data may be infrequent, the reliability of the operation of a PLD for a user design may be affected by such unintentional alteration of configuration data. Additional approaches may be needed to provide the reliability of operation required for certain high-reliability applications. In addition, as successive generations of PLDs are produced, the number of stored bits of configuration is increasing, and the reliability of the operation of PLDs may be increasingly impacted.

The present invention may address one or more of the above issues.

SUMMARY OF THE INVENTION

Various embodiments of the invention provide a method for refreshing the configuration data in an integrated circuit (IC). For each subset of the configuration data, a respective indicator is determined that indicates whether a subset of configuration memory of the IC requires refreshing with the subset of configuration data. A schedule for refreshing the subsets of configuration memory is generated from the indicators. The subsets of configuration memory are refreshed according to the schedule, with one subset being refreshed more frequently than another subset.

Various other embodiments of the invention provide a method for generating configuration data including a plurality of frames for an IC. Initial configuration data is generated for a user design including a function that refreshes the frames according to a schedule. A respective indicator that each frame needs refreshing is determined. The schedule for refreshing the frames is generated from the indicators, and the configuration data is generated by merging the schedule into the initial configuration data.

Various alternative embodiments of the invention provide an IC arrangement including an array of programmable resources, a memory, and a refresher. The programmable resources are adapted to implement a user design by loading configuration data generated from a specification of the user design into a plurality of frames in the IC. The memory is adapted to store the configuration data that includes a respective value for each frame in the IC. The refresher refreshes the frames in the IC with the values from the memory. Each frame is refreshed with the respective value according to a schedule, with one frame refreshed more frequently than another frame.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
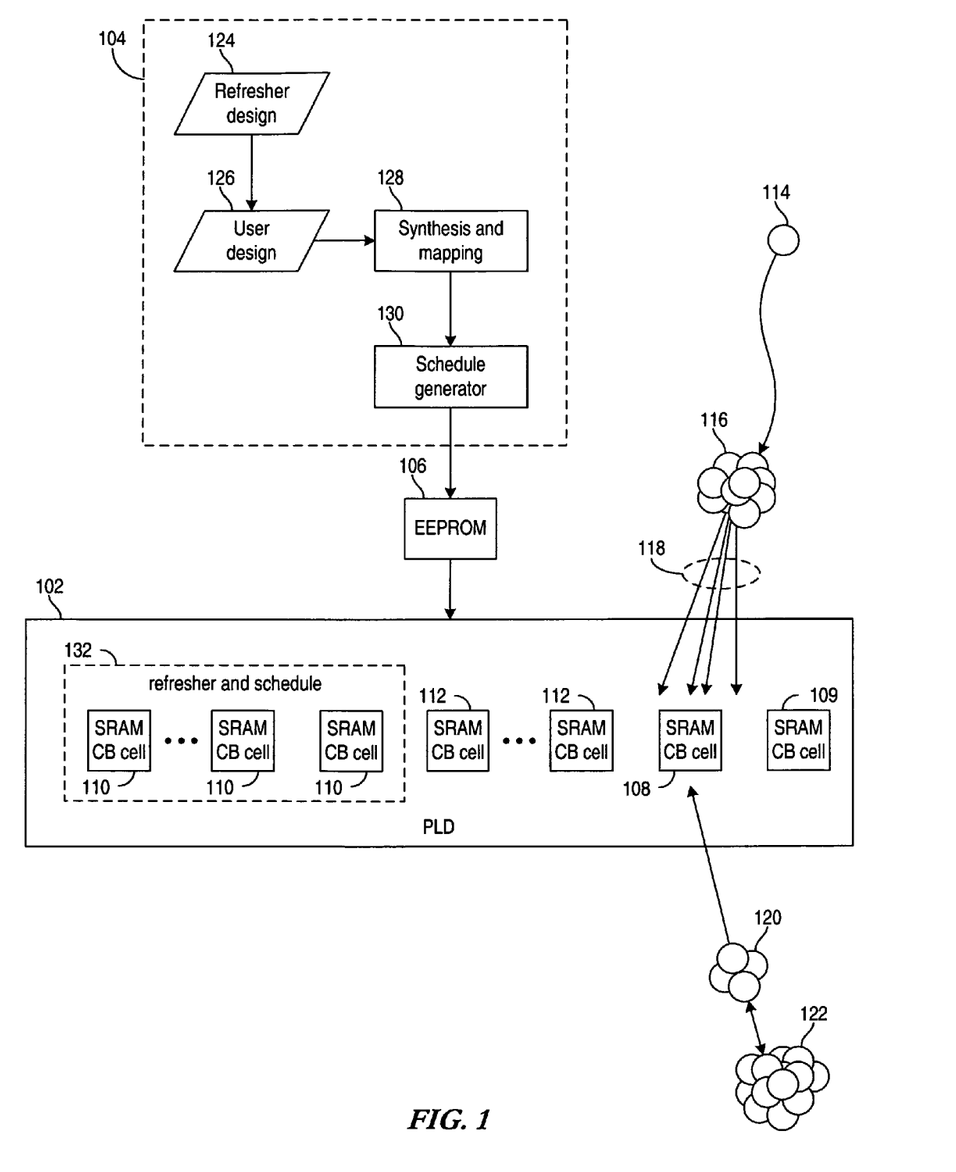
FIG. 1 is a diagram of a PLD and a process for generating the configuration data for the PLD in accordance with various embodiments of the invention.

FIG. 1 is a diagram of a PLD 102 and a process 104 for generating the configuration data for the PLD 102 in accordance with various embodiments of the invention. A PLD arrangement includes the PLD 102 and a memory 106 that may be, for example, a nonvolatile memory such as an electrically-erasable programmable read-only memory (EEPROM). The configuration data generated by process 104 may be stored in memory 106 and the configuration data may be loaded from memory 106 into configuration memory cells 108, 109, 110, and 112 in PLD 102 during a reset or initialization of PLD 102. In various embodiments, subsets of the configuration data are reloaded from memory 106 into some or all of corresponding configuration memory cells 108, 109, and 112 during operation of PLD 102 to refresh the configuration data in the PLD 102. In certain embodiments, appropriate subsets of the configuration data may also be reloaded from memory 106 into corresponding configuration memory cells 110 during operation of PLD 102. Note that while the examples below describe embodiments including a PLD, other embodiments of the invention may include other types of configurable integrated circuits, such as partially programmable devices. In general, embodiments of the present invention may be beneficial for any device that may have data susceptible to unintentional alteration.

A particle 114 of cosmic radiation may strike the nucleus 116 of an atom in the atmosphere of the Earth. The collision between cosmic particle 114 and nucleus 116 may generate several additional particles that subsequently collide with the nuclei of other atoms in the atmosphere and/or the environment of the PLD 102. These collisions and additional collisions may generate a stream 118 of atomic particles that impact a memory cell 108 of the PLD. The stream 118 of atomic particles may alter the value of a bit of the configuration data that is stored in memory cell 108.

A memory cell 108 may also be impacted by a high-energy atomic particle 120, such as an alpha particle, from the radioactive decay of nucleus 122 in the environment of PLD 102. An impact by high-energy atomic particle 120 may also alter the value of a bit of the configuration data that is stored in memory cell 108. It will be appreciated that particles 114 and 120 are example causes of unintentional alteration of the value stored in memory cell 108. Such unintentional alteration is sometimes known as a single event upset, or an SEU. Other causes may exist for unintentional alteration of data stored in memory cells, including other sources of radiation, or environmental conditions such as noise, electromagnetic interference, or temperature. Refreshing or overwriting of the configuration data, for example from a memory 106, may restore the unintentionally altered value in memory cell 108 to the proper value. In general, in order to improve reliability the configuration data may be refreshed (or "scrubbed") periodically from a storage that is immune, or at least less susceptible, to unintentional alteration.

In one embodiment, the configuration data is refreshed by a refresher having refresher design 124 that is included as part of a user design 126. The refresher design 124 may refresh various subsets of the configuration data according to a schedule. Well-known tools 128, such as synthesis, mapping, placement, or routing tools, may translate the user design 126 into configuration data (e.g., a bitstream) that implements the user design 126 when loaded into the PLD 102. A schedule generator 130 may determine relative levels of importance for the subsets that need refreshing, and the schedule generator 130 may generate the refresh schedule from indicators of the relative levels of importance for the subsets. For example, a subset of the configuration data stored in memory cells 108 and 109 may need refreshing twice as often as another subset stored in memory cells 112, and the schedule may alternate one refresh of memory cells 112 with two refreshes of memory cells 108 and 109. The schedule generator 130 may modify the configuration data from tools 128 by replacing a default schedule in the refresher design 124 with the generated schedule.

The configuration data with the generated schedule may be stored in memory 106, and PLD 102 may implement the user design 126 including refresher design 124 after loading the configuration data from memory 106 into memory cells 108, 109, 110, and 112, which each may store a bit of the configuration data in a static random access memory (SRAM) cell. The memory cells 110 storing a portion of the configuration data may be used to implement the refresher 132 together with the refresh schedule in the PLD 102. During operation of PLD 102, the refresher 132 implemented in PLD 102 using memory cells 110 may continuously read subsets of configuration data from memory 106 and store or overwrite the subsets in a corresponding subset of memory cells 108, 109, and 112. Optionally, the refresher 132 may also refresh itself by also reading appropriate subsets of the configuration data from memory 106 and storing the subsets in memory cells 110. The refreshing of the configuration data by refresher 132 according to the schedule may improve the reliability of the PLD 102 by diminishing or eliminating improper operation of the user design 126 in PLD 102 due to unintentional alteration of the configuration data stored in one or more of memory cells 108, 109, 112, and optionally 110. In some embodiments, the refresher 132 may be implemented in hard (e.g., non-programmable) logic, rather than in programmable logic of the device, in order to reduce or eliminate its susceptibility to unintentional alteration. Similarly, in some embodiments, the schedule may be stored in non-volatile memory cells to improve reliability.

In one embodiment, the subsets refreshed more frequently are the subsets for which unintentional alteration is more likely to cause improper operation of the user design 126 in the PLD 102. The unintentional alteration of a bit of configuration data stored in PLD 102, such as the bit of configuration data stored in memory cell 108, may cause improper operation of the user design 126 implemented by PLD 102. The user design 126 implemented in PLD 102 may continue operating properly after the unintentional alteration of certain other bits of configuration data stored in PLD 102. For example, certain resources in PLD 102 may be unnecessary or otherwise unused to implement user design 126, and thus the configuration data for these unused resources may have any value without affecting the function implemented by PLD 102. A susceptibility analysis by the schedule generator 130 may analyze the likelihood of improper operation of the user design 126 being caused by an unintentional alteration of each SRAM cell 108, 109, 112, and optionally 110. These likelihoods for each bit of a subset may collectively indicate a relative importance of the subset needing refreshing.

Figure 2:
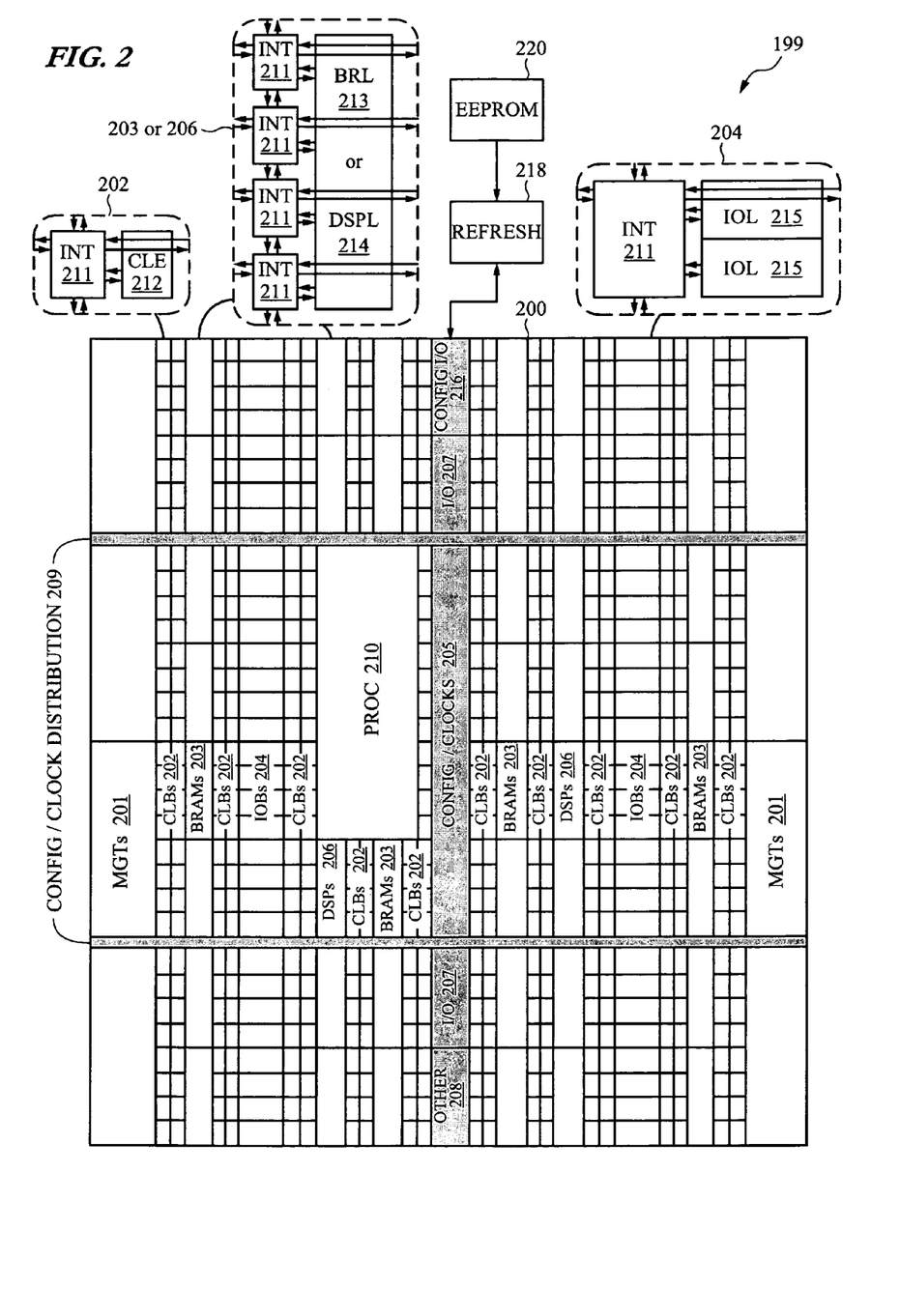
FIG. 2 is a block diagram of a PLD arrangement having configuration data refreshed in accordance with various embodiments of the invention.

FIG. 2 is a block diagram of a particular PLD arrangement 199 having configuration data refreshed in accordance with various embodiments of the invention. The PLD 200 may be programmed with configuration data from the EEPROM 220 during reset or initial configuration of the PLD 200. In one embodiment, refresher 218 external to the PLD 200 refreshes the configuration data stored in the PLD 200 from the EEPROM 220 according to a schedule. In some embodiments, refresher 218 may be integrated with EEPROM 220, one or both of refresher 218 and EEPROM 220 may be integrated with PLD 200.

Certain PLDs, such as advanced FPGAs, can include an array of programmable tiles having several different types of programmable logic and routing resources. For example, FIG. 2 illustrates a PLD 200 with an FPGA architecture that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., clock ports), configuration I/O port 216, and other programmable logic 208 such as digital clock managers, analog-to-digital converters, system monitoring logic, and so forth. Some FPGAs also include one or more dedicated processor blocks (PROC 210), which may execute a software routine that implement all or a portion of a refresher, such as refresher 132 of FIG. 1.

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 may be manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA. Configuration data from EEPROM 220 may be loaded by refresher 218 into configuration memory cells in the programmable logic and routing resources 201, 202, 203, 204, 206, and 208 via configuration I/O port 216, configuration and clocking circuits CONFIG/CLOCKS 205, and the configuration distribution signals of areas 209.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
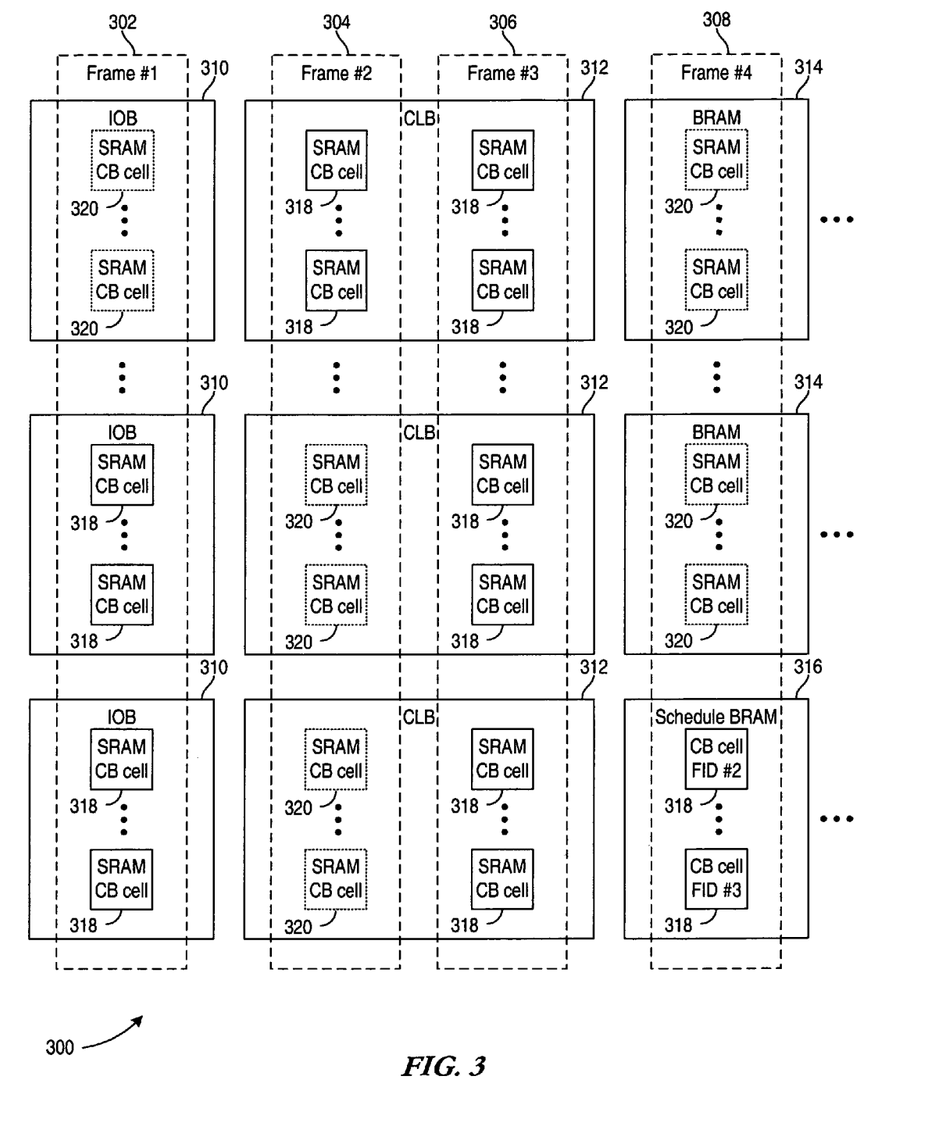
FIG. 3 is a block diagram of programmable resources of a PLD having stored configuration data arranged in frames of configuration bits in accordance with various embodiments of the invention.

FIG. 3 is a block diagram of programmable resources of a PLD 300 having stored configuration data arranged in frames 302, 304, 306, 308 of configuration bits in accordance with various embodiments of the invention. In general, a frame is a subset of the configuration data. For example, frames may be organized and selected for efficient transfer of configuration data. In some embodiments, each frame may include configuration data for similar resources, or resources that are physically located near one another. For instance, the PLD 300 may have columns of programmable resource tiles, including columns of IOBs 310, columns of CLBs 312, and columns of BRAMs 314 and 316. Each column of the programmable resource tiles may include one or more frames of the configuration data. The column of IOBs 310 may include frame-1 (302), the column of CLBs 312 may include frame-2 (304) and frame-3 (306), and the column of BRAMS 314 and 316 may include frame-4 (308). Each of frames 302, 304, 306, 308 may have, for example, a numeric identifier, frame identifier (FID) #1, FID #2, FID #3, and FID #4, respectively.

The configuration data stored in PLD 300 in frames 302, 304, 306, 308 programs PLD 300 to implement a user design. Certain bits of configuration data stored in memory cells 318 are essential to implement the user design in the PLD 300 and certain other bits stored in memory cells 320 are unused by the user design and may be given any value without modifying the function of the user design. For one example of a possible user design, approximately 40 percent of the configuration bits may be essential bits and the remaining approximately 60 percent of the configuration bits may be unused bits.

In one embodiment, the number of essential bits stored in memory cells 318 in each frame may provide an indication of the relative importance that the frame be refreshed. For example, frame-3 (306) having FID #3 may have the highest importance with six essential bits, followed by frame-1 (302) having FID #1 with four essential bits, and frame-2 (304) having FID #2 with two essential bits. Frame-4 (308) having FID #4 may be unused and thus has no essential bits. A corresponding schedule may refresh frame-3 (306) most frequently, followed by frame-1 (302), frame-2 (304), and frame-4 (308), which may refreshed rarely or not at all.

In one embodiment, the user design includes a refresher that refreshes the frames 302, 304, 306, 308 of the configuration data according to a schedule that is stored, for example, in BRAM 316. The refresh schedule stored in BRAM 316 may be an ordered list of frame identifiers, and the frames may be sequentially refreshed in the order provided by the schedule. The list of frame identifiers may be a circular list and the frames of the PLD 300 may be continuously refreshed in the order provided by the circular list. For example, the circular list of frame identifiers may be FID #3, FID #1, FID #3, FID #2, FID #3, and FID #1, such that for every refresh of frame-2 (304), frame-1 (302) is refreshed twice and frame-3 (306) is refreshed thrice.

Figure 4:
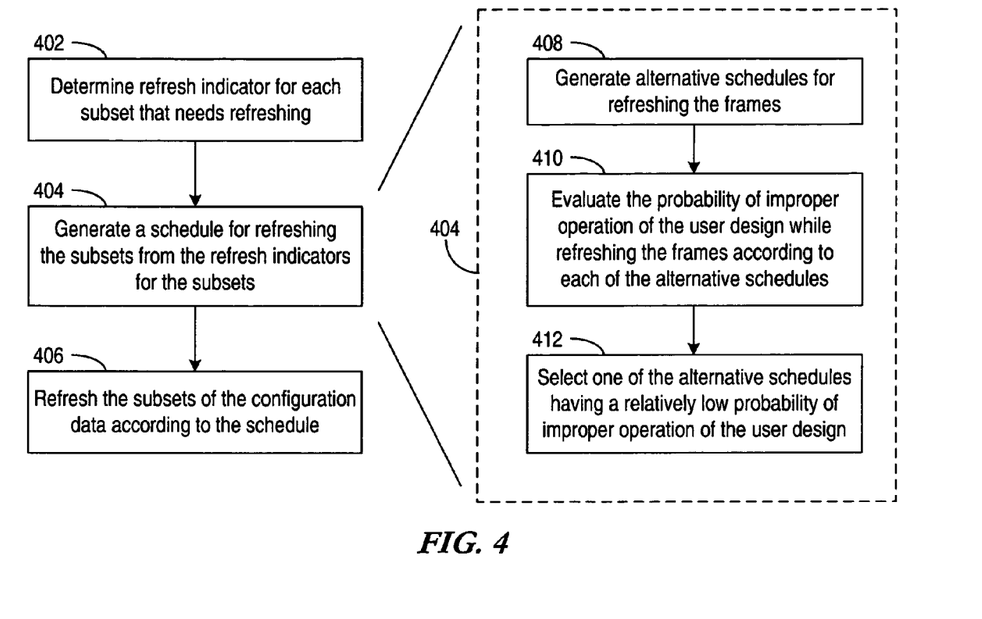
FIG. 4 is a process for refreshing the configuration data in a PLD in accordance with various embodiments of the invention.

FIG. 4 is a process for refreshing the configuration data in a PLD in accordance with various embodiments of the invention. Subsets of the configuration data are refreshed according to a schedule that is generated from indicators of the need to refresh each subset.

At step 402, a refresh indicator is determined for each subset of configuration data. The refresh indicator for a subset specifies the relative importance of refreshing the appropriate configuration memory cells with that subset of configuration data. In one embodiment, the number of essential bits in each subset may provide the indicator of the relative importance that the subset be refreshed. For example, an indicator for each subset may be a ratio of a number of the essential configuration bits in the subset to a number of the essential configuration bits in the configuration data. In another embodiment, the relative importance is a likelihood that an unintentional alteration of a subset causes improper operation of a user design implemented in the PLD. A likelihood for a subset, such as a frame, may be determined from the probabilities that unintentional alteration of each bit of the subset causes improper operation of the user design implemented in the PLD. As another example, other factors may also be used as indicators of the relative importance of the subset, such as designation by the user, clock frequency, or analysis of test vectors.

For a PLD having N frames each containing M bits, refreshing one of the frames may take a time interval of length T For each bit, b may be the probability that an unintentional alteration occurs during a time interval of length T. To clarify the discussion, probability b is considered to be the same for each bit of configuration data stored in the PLD. However, it will be appreciated that such a probability may vary between configuration bits, for example, a different SRAM implementation may be used for BRAMs than for other types of programmable resources and therefore BRAMs may have a different probability b than the other types of programmable resources. Other factors may also contribute to variations in the probability, such as manufacturing variations and differing environmental or operational conditions.

For a particular user design, k[i] bits of frame i are essential bits used to implement the user design in the PLD. Improper operation of the user design may be caused by unintentional alteration of these essential bits. The probability of improper operation caused by unintentional alteration of frame i in the time interval T is $$p[i]=1-(1-b)^{k[i]},$$

and the probability of improper operation of the PLD in time interval T is $$P = 1 - \prod_i (1 - p[i]).$$

To improve the reliability of the PLD, the frames may be periodically refreshed. Various embodiments of the invention may refresh the frames at various refresh rates, such that the frames more likely to cause improper operation may be refreshed more frequently. For each frame, a nominal refresh frequency f[i] is determined that is a per-unit fraction of the available refresh bandwidth, such that $$0 \le f[i] \le 1 \text{ for all } f[i], \text{ and } \sum_i f[i] \le 1.$$

For continuous refreshing, the sum of the nominal refresh frequencies f[i] is one. Less than continuous refreshing may be used to reduce power consumption from the refreshes when the target reliability may be achieved with less than continuous refreshing. The time between refreshes of frame i is $$t[i] = \frac{T}{f[i]}.$$

Improper operation of the user design may occur a time interval of length u[i,j] after an unintentional alteration of bit j in a frame i. For a bit j of frame i that immediately causes improper operation of the user design, the time interval u[i,j] is zero and refreshing frame i does not prevent immediate improper operation following unintentional alteration of bit j. For a bit j of frame i having a non-zero u[i,j], improper operation of the user design may be prevented when frame i is refreshed within the time interval of length u[i,j] after the unintentional alteration. When t[i]<u[i,j], frame i is refreshed at least once between the unintentional alteration of bit j of frame i and the impending improper operation such that the improper operation may always be prevented. When t[i]>u[i,j], refreshes of frame i may sometimes prevent improper operation due to the unintentional alteration of bit j of frame i.

The delay u[i,j] may be different for each bit of each frame, depending upon many factors including whether the bit is an unused bit or an essential bit. For example, a user design may include a processor with an arithmetic logic unit that executes various instructions including add instructions, multiply instructions, and shift instructions. Respective portions of the arithmetic logic unit may be dedicated to executing each of the add, multiply, and shift instructions, and corresponding configuration bits may implement each respective portion of the arithmetic logic unit in the PLD. The user design may also include a program executing on the processor. Profiling of the execution of the program on the processor may provide an average time interval between the execution of any instruction by the processor and the next add instruction. This average time interval may be used to approximate u[i,j] for the configuration bits of the portion of the arithmetic logic unit that implement the add instruction. The u[i,j] for the configuration bits of other portions of the arithmetic logic unit may be approximated by similar average time intervals for the multiply and shift instructions.

The criticality c[i,j] of bit j of frame i is the inverse of the delay u[i,j] and the criticality quantifies a need to refresh frame i contributed by bit j. For unused bits the criticality is zero, and for essential bits the criticality is non-zero.

During continuous refreshing of the configuration data, the probability that improper operation occurs after the unintentional alteration of bit j of frame i is zero when t[i]<u[i,j], that is when c[i,j]t[i]<1; otherwise, this probability may be proportional to the amount of time between refreshes t[i] that exceeds the delay u[i,j], $$\frac{t[i] - u[i,j]}{t[i]} = 1 - \frac{u[i,j]}{t[i]} = 1 - \frac{1}{c[i,j]t[i]}.$$

Thus, the probability of improper operation during continuous refresh due to unintentional alteration of bit j of frame i is $$p_r[i,j] = \begin{cases} 0 & c[i,j]t[i] \le 1 \\ \left(1 - \frac{1}{c[i,j]t[i]}\right)b & \text{otherwise.} \end{cases}$$

The probability of improper operation of during continuous refresh due to unintentional alteration of any bit of frame i is $$p_r[i] = 1 - \prod_j (1 - p[i,j]).$$

Probability p[i] may provide an indicator that frame i needs refreshing for given nominal refresh frequencies f[i]. The probability of improper operation of the user design during continuous refresh due to unintentional alteration of any bit of any frame is $$P_r = 1 - \prod_i (1 - p[i]).$$

This probability of improper operation above is denoted the "failure" probability for the nominal refresh frequencies f[i], 1≦i≦N.

At step 404 of FIG. 4, a schedule for refreshing the subsets is generated from the respective indicator for each subset. In one embodiment, the indicator for each subset may be a ratio of a number of the essential configuration bits in the subset to a number of the essential configuration bits in the configuration data, and the schedule may allocate to each frame a fraction of the refresh bandwidth that is approximately equal to this indicator. In another embodiment shown in steps 408, 410, and 412, the schedule for refreshing the subsets is generated by evaluating the failure probability during continuous refresh according to various alternative schedules.

At step 408, alternative schedules for refreshing the frames are generated. These alternative schedules may allocate approximately a fraction f[i] of the refresh bandwidth to frame i. To allocate exactly a fraction f[i] of the refresh bandwidth to frame i, an infinitely long refresh schedule may generally be necessary (which may be impractical). The alternative schedules have a finite length and may each have an actual refresh frequency g[i] that approximates the nominal refresh frequency f[i] for each frame i.

Nominal refresh frequencies f[i] may be determined by a search procedure that searches for a minimum for the failure probability, P, as illustrated by the following pseudocode for Example 1.

```
nominal_frequencies ( ε ) is
    while ε > tolerance
        modified := true
        while modified
            modified := false
            for a = 1 to N −1
                for b = a + 1 to N
                    modified := modified or modify ( a, b, ε )
        ε = reduce ( ε )
modify ( a, b, ε ) is
    if f[a] < ε or f[b] < ε or f[a] > 1 − ε or f[b] > 1 − ε
        return false
    p0 = P ( f[1], . . . , f[N] )
    p1 = P ( f[1], . . . , f[a] + ε, . . . , f[b] − ε, . . . , f[N] )
    p2 = P ( f[1], . . . , f[a] − ε, . . . , f[b] + ε, . . . , f[N] )
    if min( p1, p 2 ) < p0 then
        if p1 < p2 then
            f[a] := f[a] + ε
            f[b] := f[b] − ε
        else
            f[a] := f[a] − ε
            f[b] := f[b] + ε
        return true
    else
        return false
```

EXAMPLE 1

The process of Example 1 may repeatedly modify the nominal refresh frequencies f[i] for frames 1≦i≦N by checking the failure probability for various candidate adjustments of the nominal refresh frequencies. The nominal refresh frequencies are updated with each candidate adjustment that decreases the failure probability. A candidate adjustment of the nominal refresh frequencies may increase the refresh frequency for one frame by an amount ε and decrease the refresh frequency for another frame by the same amount ε. For continuous refreshing, the sum total of the frequencies has a value of one and adjustments that increase one nominal refresh frequency by ε and decrease another nominal refresh frequency by ε do not change this sum total. The checking of the failure probability continues for each combination of increasing the refresh frequency by ε for one frame and decreasing the refresh frequency by ε for another frame until the failure probability stops decreasing. This checking of the failure probability may then be repeated with a smaller value for ε.

The initial value of a nominal refresh frequency f(i) for frame i may be ratio of a number of the essential configuration bits in frame i to a number of the essential configuration bits in the configuration data. The nominal refresh frequency f(i) for frame i may provide the indicator of step 402 that is a likelihood that an unintentional alteration of frame i causes improper operation of a user design implemented in the PLD using the configuration data.

Each alternative schedule may be a circular list of frame identifiers and a refresher may refresh the frames of configuration data in the PLD continuously in a sequence provided by the circular list. At step 408 of FIG. 4, the circular lists for the alternative schedules are generated. A search of alternative schedules may first determine the number of refreshes, C[i], for each frame i in a circular list and then determine the ordering of these refreshes in the circular list. The length of the schedule, L, may have an upper bound that constrains the length of the circular list, and the alternative schedules generated may have various lengths below this upper bound.

At step 410, the alternative schedules are evaluated. The evaluation may be provided by the following figures of merit, δ and γ, $$\delta = \frac{1}{N} \sum_{i=1}^{N} \text{abs}\left(f[i] - \frac{C[i]}{N}\right)$$

for the number of frames, N, $$\gamma = \frac{1}{L} \sum_{i=1}^{N} \sum_{j=1}^{C[i]} \text{abs}\left(\frac{1}{f[i]} - D[i, j]\right)$$

for the schedule length $$L = \sum_{i=1}^{N} C[i].$$

The figure of merit δ may provide a measure of the amount that the actual refresh frequencies g[i]=C[i]/N for the schedule differ from the nominal refresh frequencies f[i]. The refreshes of frame i occur C[i] times in the schedule and the distance in the schedule between refreshes j and j+1 of frame i is provided by D[i,j]. When refresh j for frame i is immediately followed by another refresh of frame i, D[i,j]=1, and for j=C[i] the distance wraps around the end of the circular schedule. The figure of merit γ may provide a measure of the amount that the spacing between refreshes D[i,j] differs from the nominal spacing between refreshes 1/f[i] for the frames $0 \leq i \leq N$.

At step 412, a schedule for refreshing the frames is selected from the alternative schedules. The selected schedule may be one of the alternative schedules that has the minimum value for the figure of merit δ. When only one alternative schedule has the minimum value for the figure of merit δ, this alternative schedule may be selected as the schedule for refreshing the frames. When multiple alternative schedules have the minimum value for the figure of merit δ, one of these alternative schedules that has the minimum value among these alternative schedules for the figure of merit γ may be selected as the schedule for refreshing the frames.

At step 406, the subsets, such as the frames, of the configuration data are refreshed according to the generated schedule. The reliability may be improved by the refreshing of the subsets of the configuration data according to the schedule. It will be appreciated that the schedule may be a circular list that includes a null frame identifier indicating a skipping of the refreshing of a subset during a corresponding refresh time interval, T. Less than continuous refreshing that skips refreshing a subset during certain refresh time intervals may be advantageous, for example, when continuous refreshing provides more reliability than the reliability target for a particular application, or when power is a greater concern than reliability.

Figure 5:
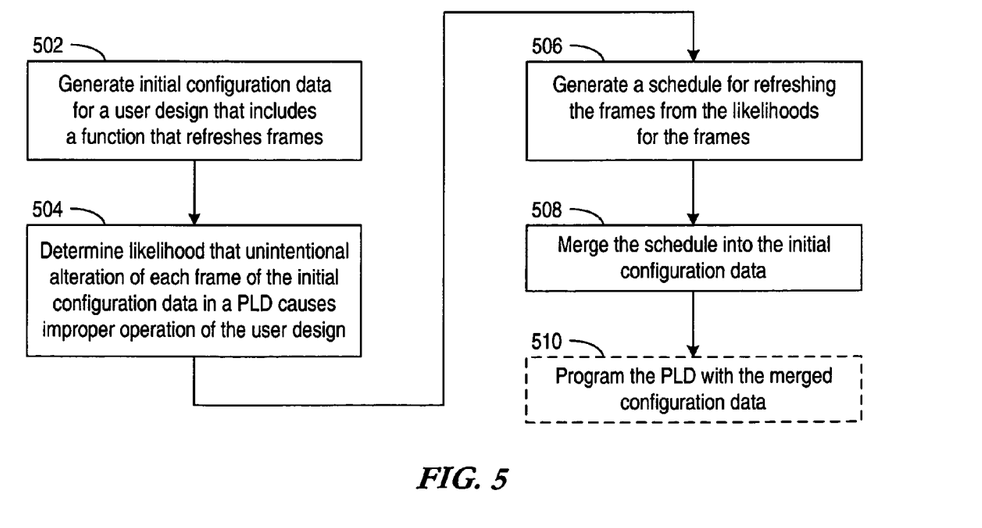
FIG. 5 is a process for generating configuration data for a PLD in accordance with various embodiments of the invention.

FIG. 5 is a process for generating configuration data for a PLD in accordance with various embodiments of the invention. Configuration data may be generated to implement a user design and a refresher design in a PLD. The refresher refreshes the configuration data during PLD operation.

At step 502, an initial version of the configuration data is generated for the user design. Synthesis and mapping tools may generate the configuration data from specifications of the user design and the refresher design. The refresher design may include a default schedule, such as sequentially refreshing each frame of the PLD. The refresher may read the schedule during PLD operation from a memory, such as a BRAM of the PLD. The data read by the refresher from the memory may be a circular list of identifiers of the frame to be refreshed. The default schedule may be included in the refresher design as initialization data for the BRAM.

At step 504, a likelihood, which indicates whether unintentional alteration of a frame causes improper operation of the user design, or another similar indicator is determined for each frame from the initial version of the configuration data. At step 506, a schedule for refreshing the frames is generated from the likelihoods. The schedule may be a circular list of frame identifiers with various numbers of the frame identifiers occurring in the circular list. At step 508, the generated schedule may be merged with the initial version of the configuration data to generate configuration data for the user design and a refresher design using the generated schedule. In one embodiment, BRAM initialization data is produced from the generated schedule and the BRAM initialization data for the generated schedule replaces the BRAM initialization data for the default schedule.

At optional step 510, the user design and the refresher design with the generate schedule are implemented in the PLD by programming the PLD with the merged configuration data. The refresher implemented in the PLD may immediately begin refreshing the frames of the configuration data according to the generated schedule.

Figure 6:
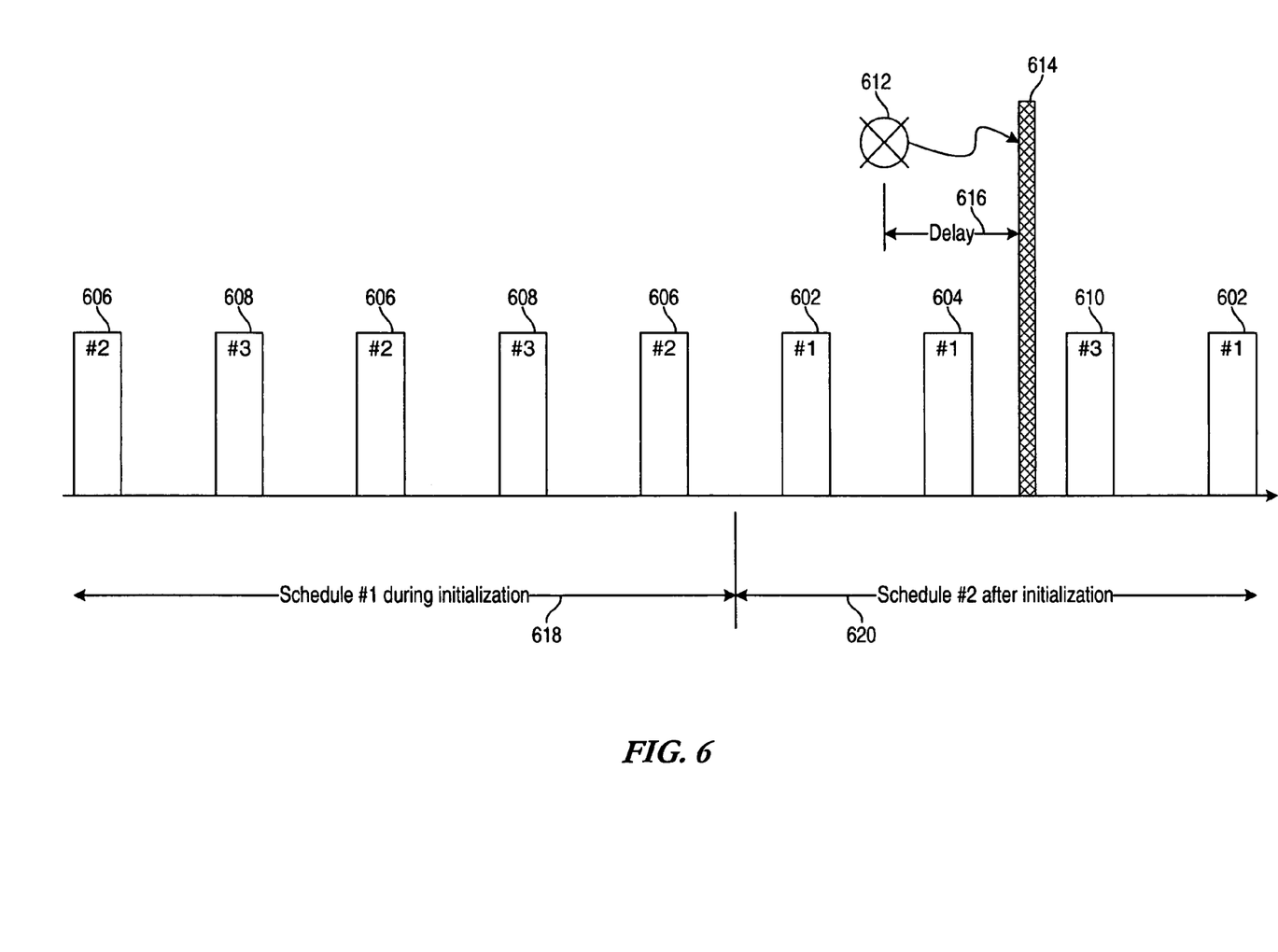
FIG. 6 is a timeline of a process illustrating refreshing of the configuration data in a PLD in accordance with various embodiments of the invention.

FIG. 6 is a timeline of a process illustrating refreshing of the configuration data in a PLD in accordance with various embodiments of the invention. The timeline includes refreshes 602 and 604 for subset-1 of the configuration data, refreshes 606 for subset-2, and refreshes 608 and 610 for subset-3.

An unintentional alteration 612 of a configuration bit may be a single event upset caused by cosmic radiation or other sources. The unintentional alteration 612 may subsequently cause improper operation 614. An example improper operation 614 is an output of the PLD deviating from the expected value of the output for the user design. The time interval of line 616 between the unintentional alteration 612 and the improper operation 614 is the delay interval used to calculate the criticality of the configuration bit undergoing the unintentional alteration 612. The delay interval of line 616 and corresponding criticality may vary between bits of the configuration data. A refresh 604 refreshes subset-1 within the delay interval of line 616 and when the configuration bit undergoing the unintentional alteration 612 is in subset-1, refresh 604 may prevent the improper operation 614 from occurring. When the configuration bit undergoing the unintentional alteration 612 is instead in subset-3, the improper operation 614 is not prevented. When the delay interval of line 616 is a delay of zero, corresponding to immediate improper operation following the unintentional alteration 612, preventing the improper operation 614 by refreshing configuration data may be impossible.

Various embodiments of the invention provide a method to improve the reliability of a PLD by refreshing subsets of the configuration data according to a schedule generated from an approximation for the delay interval of line 616. It will be appreciated that even a crude approximation for the delay interval may significantly improve the reliability of PLD as compared to a simply refreshing the subsets in a linear order. It will be appreciated that many methods may be used to produce an approximation of the delay interval. In one embodiment, the delay interval is infinite for the unused bits and is approximated as zero for the essential bits.

In one embodiment, refreshing of the configuration data uses different schedules at different times. For example, during a time interval of line 618, the refreshing uses a first schedule that is a circular list containing a frame identifier of subset-2 for refreshes 606 and a frame identifier of subset-3 for refreshes 608, and during a time interval of line 620, the refreshing uses a second schedule that is a circular list containing a frame identifier of subset-1 for refreshes 602, the frame identifier of subset-1 again for refresh 604, and the frame identifier of subset-3 for refresh 610.

A refresher may select the schedule based on operating state of the PLD and/or the user design in the PLD. For example, a reset of the user design may start an initialization procedure during an initialization state of the user design. During the initialization interval of line 618 for the initialization state, the first refresh schedule may predominately refresh the subsets related to the initialization of the user design. After completion of the initialization interval of line 618, the user design may enter an execution state during an execution interval of line 620. In response to the execution state, the refresher may switch to a second refresh schedule that predominately refreshes the subsets related to the execution of the user design. In one embodiment, each of the two or more refresh schedules may be fixed schedules that are merged into the configuration data for the user design. One of the schedules may be selected as the actual refresh schedule dynamically during the operation of the user design in the PLD, for example, when the PLD is switched between a fixed number of configurations having respective refresh schedules. In another embodiment, a refresh schedule may be dynamically assembled from various partial schedules during the operation of the user design in the PLD.

It will be appreciated that the refresher may monitor multiple operating states of the user design and select an appropriate schedule for refreshing in response to the operating state. In one embodiment, a designer of the user design may choose the operating states affecting the schedule. In addition, the designer may indicate the relative importance of refreshing the subsets. For example, parameters for each module in a Verilog or VHDL specification of the user design may provide an indicator of relative importance of refreshing the module for each operating state. After synthesis and mapping of the user design, an indicator that a subset needs refreshing may be generated from a weighted average of the designer-provided indicators with the weights being the numbers of configuration bits in the subset for each of the modules. The designer may also be able to manually adjust the generated schedule.

A PLD that is reconfigured during normal operation, including reconfiguration by the PLD, may select or generate a schedule for refreshing corresponding to the currently configured operation of the PLD. For a PLD that is partially reconfigured, each partial reconfiguration of the PLD may have an associated partial schedule. A weighted average of designer-provided indicators may be dynamically computed by the refresher during operation of the PLD from the partial schedules depending on the partial reconfigurations that are currently active. The subsets may be a frame of the configuration data or the subsets may the respective portion of the configuration data for each tile of the PLD.

What is claimed is:

1. A method for refreshing configuration data for configuring programmable resources of an integrated circuit (IC), comprising:

for each of a plurality of subsets of the configuration data, determining a respective indicator that a subset of configuration memory of the IC requires refreshing with the subset of configuration data;

generating a schedule for refreshing the subsets of configuration memory from the indicators; and refreshing the subsets of configuration memory according to the schedule, wherein one of the subsets is refreshed more frequently than another one of the subsets is refreshed, wherein the indicator for each subset indicates a respective likelihood that unintentional alteration of the subset causes improper operation of a user design implemented in the IC using the configuration data.

2. The method of claim 1, wherein the configuration data of the IC includes a plurality of frames that are the subsets of the configuration data.

3. The method of claim 1, wherein the schedule is a circular list of identifiers of the subsets of the configuration data, and the refreshing includes refreshing the subsets in a repeating sequence provided by the circular list of identifiers.

4. The method of claim 1, wherein each one of a plurality of configuration bits of the configuration data has a respective probability that unintentional alteration of the configuration bit causes improper operation of the user design, and the likelihood for each subset is a corresponding probability that improper operation of the user design is caused by unintentional alteration of the configuration bits in the subset.

5. The method of claim 1, wherein the configuration data includes a plurality of configuration bits that include a plurality of essential configuration bits for which modification of each essential configuration bit modifies the user design, and the likelihood for each subset is based on the essential configuration bits in the subset.

6. The method of claim 5, wherein the likelihood for each subset is a ratio of a number of the essential configuration bits in the subset to a number of the essential configuration bits in the configuration data.

7. The method of claim 1, wherein the configuration data includes a plurality of configuration bits, each of the configuration bits having a respective criticality, and the likelihood for each subset is based the criticalities of the configuration bits in the subset.

8. The method of claim 7, wherein the criticality of each configuration bit is inversely proportional to a magnitude of a time interval between a modification of the configuration bit and improper operation of the user design.

9. The method of claim 1, wherein the unintentional alteration of the subset alters one of a plurality of configuration bits of the configuration data that is in the subset.

10. The method of claim 1, wherein the likelihood for a first one of the subsets is greater than the likelihood for a second one of the subsets, and the first subset is refreshed more frequently than the second subset.

11. The method of claim 1, wherein the schedule is a selected schedule and generating the schedule comprises:

generating a plurality of working schedules for refreshing the subsets;

evaluating a respective probability of improper operation of the user design during refreshing of the subsets of the configuration data according to each of the working schedules; and selecting one of the working schedules as the selected schedule, wherein the selected schedule has a low value for the respective probability of improper operation relative to other respective probabilities.

12. A method for generating configuration data that includes a plurality of frames, the configuration data for configuring programmable resources of an integrated circuit (IC), comprising:

generating initial configuration data for a user design that includes a function that refreshes the frames according to a schedule;

for each frame, determining a respective indicator that the frames needs refreshing;

generating the schedule for refreshing the frames from the indicators; and merging the schedule into the initial configuration data, wherein the indicator for each frame is a respective likelihood that unintentional alteration of the frame causes improper operation of the user design implemented in the IC using the initial configuration data.

13. The method of claim 12, wherein the function monitors at least one operating condition of the user design and refreshes the frames according to the schedule that is dependent on the operating condition.

14. The method of claim 13, wherein the at least one operating condition includes completion of an initialization of the user design.

15. An integrated circuit (IC) arrangement, comprising:

an array of programmable resources on an integrated circuit, wherein the programmable resources are adapted to implement a user design in response to loading configuration data generated from a specification of the user design into a plurality of frames in the IC;

a memory adapted to store the configuration data that includes a respective value for each frame in the IC; and a refresher adapted to refresh the frames in the IC with the values from the memory, wherein each frame is refreshed with the respective value according to a schedule, and wherein one of the frames is refreshed more frequently than another one of the frames is refreshed.

16. The IC of claim 15, wherein at least a portion of the refresher is implemented in the user design in the IC.

17. The IC of claim 15, wherein at least a portion of the refresher is implemented external to the IC.

18. The IC of claim 15, wherein at least a portion of the refresher is implemented in a software routine executing on a processor.

* * * * *